(12) United States Patent
Kim et al.

(10) Patent No.: US 6,818,514 B2
(45) Date of Patent: Nov. 16, 2004

(54) SEMICONDUCTOR DEVICE WITH DUAL GATE OXIDES

(75) Inventors: Inki Kim, Seoul (KR); Sang Yeon Kim, Chungcheng-bukdo (KR); Min Paek, Chongju (KR); Chiew Sin Ping, Kuala Lumpur (MY); Wan Gie Lee, Namyangju-si (KR); Choong Shiau Chien, Penang (MY); Zadig Lam, Singapore (SG); Hitomi Watanabe, Tokyo (JP); Naoto Inoue, Chiba (JP)

(73) Assignee: SilTerra Malaysia Sdn. Bhd. (MY)

( * ) Notice: Subject to any disclaimer, the term of this patent is extended or adjusted under 35 U.S.C. 154(b) by 0 days.

(21) Appl. No.: 10/377,167

(22) Filed: Feb. 26, 2003

(65) Prior Publication Data

US 2004/0166698 A1 Aug. 26, 2004

(51) Int. Cl.[7] .......................................... H01L 21/8234
(52) U.S. Cl. ....................... 438/275; 438/286; 438/588; 438/981
(58) Field of Search ............................... 438/275, 286, 438/294, 588, 666, 981

(56) References Cited

U.S. PATENT DOCUMENTS

| | | | | | |
|---|---|---|---|---|---|
| 6,091,109 A | * | 7/2000 | Hasegawa | ................... | 438/981 |
| 6,165,918 A | * | 12/2000 | Jia et al. | ..................... | 438/275 |
| 6,228,721 B1 | * | 5/2001 | Yu | .............................. | 438/275 |
| 6,271,092 B1 | * | 8/2001 | Lee | ............................. | 438/286 |
| 6,420,222 B1 | * | 7/2002 | Watanabe | .................... | 438/258 |
| 6,686,246 B2 | * | 2/2004 | Gonzalez | ..................... | 439/981 |

* cited by examiner

*Primary Examiner*—Kevin M. Picardat
(74) *Attorney, Agent, or Firm*—Townsend and Townsend and Crew LLP

(57) ABSTRACT

A method for making a semiconductor device having a first active region and a second active region includes providing first and second isolation structures defining the first active region on a substrate. The first active region uses a first operational voltage, and the second active region uses a second operational voltage that is different from the first voltage. A nitride layer overlying the first and second active regions is formed. An oxide layer overlying the nitride layer is formed. A first portion of the oxide layer overlying the first active region is removed to expose a first portion of the nitride layer. The exposed first portion of the nitride layer is removed using a wet etch method while leaving a second portion of the nitride layer that is overlying the second active region intact. Thereafter, a first gate oxide having a first thickness is formed on the first active region, the first gate oxide having a first edge facing the first isolation structure and a second edge facing the second isolation structure. The first edge is separated from the first isolation structure by a first distance. The second edge is separated from the second isolation structure by a second distance. Thereafter, a second gate oxide having a second thickness is formed on the second active region, the second thickness being different than the first thickness.

20 Claims, 6 Drawing Sheets

SEMICONDUCTOR DEVICE WITH DUAL GATE OXIDES

BACKGROUND OF THE INVENTION

The present invention relates to a method of manufacturing a semiconductor device, more particularly a device having dual gate oxides and/or a guard ring separating two active regions.

With the advances in semiconductor technology, a semiconductor device is provided increasingly with multiple functions. Such a multi-functional device is provided with different circuitries that may operate in different voltage regimes within the same chip.

In addition, as the technology advances and the devices are scaled down, the operational voltage decreases as well, particularly for high density devices. However, these high density devices, operating a low voltage, generally need to interface with other devices that may use higher Vcc. Accordingly, the high density devices are provided with an I/O circuitry to interface with the external devices having higher Vcc. For example, a high density device is provided with first circuitry configured to operate at a high voltage, e.g., about 5 volts, and second circuitry configured to operate at a low voltage, e.g., about 3.3 volts.

For optimal operation, the devices having two different voltage regimes are provided generally with dual gate oxides: a thick gate oxide configured for the high voltage and a thin gate oxide configured for the low voltage. Therefore, employing these type of combined VLSI circuits requires a technique for fabricating gate oxide layers having a significant thickness difference for diverse uses within the same silicon substrate.

BRIEF SUMMARY OF THE INVENTION

In one embodiment, a method for making a semiconductor device having a first active region and a second active region includes providing first and second isolation structures defining the first active region on a substrate. The first active region uses a first operational voltage, and the second active region uses a second operational voltage that is different from the first voltage. A nitride layer overlying the first and second active regions is formed. An oxide layer overlying the nitride layer is formed. A first portion of the oxide layer overlying the first active region is removed to expose a first portion of the nitride layer leaving a second portion of the nitride layer that is overlying the second active region intact. Thereafter, a first gate oxide having a first thickness is formed on the first active region, the first gate oxide having a first edge facing the first isolation structure and a second edge facing the second isolation structure. The first edge is separated from the first isolation structure by a first distance. The second edge is separated from the second isolation structure by a second distance. Thereafter, a second gate oxide having a second thickness is formed on the second active region, the second thickness being different than the first thickness.

Another embodiment is directed to a method for making a semiconductor device having a first active region and a second active region. The first active region uses a first operational voltage, and the second active region uses a second operational voltage that is different from the first voltage. The method includes providing first, second, and third isolation structures defining the first and second active regions on a substrate; providing a separation structure between the second and third isolation structures, the second and third isolation structures and the separation structure being provided between the first and second active regions; forming a nitride layer overlying the first and second active regions of the substrate; forming an oxide layer overlying the nitride layer; removing a first portion of the oxide layer overlying the first active region to expose a first portion of the nitride layer; removing the exposed first portion of the nitride layer while leaving a second portion of the nitride layer that is overlying the second active region intact; thereafter, forming a first gate oxide having a first thickness on the first active region and being configured to handle the first voltage; and thereafter, forming a second gate oxide having a second thickness on the second active region and being configured to handle the second voltage, the second thickness being different than the first thickness.

In yet another embodiment, a method for making a semiconductor device having a first active region and a second active region is disclosed, the first active region using a first operational voltage and the second active region using a second operational voltage that is different from the first voltage. The method includes providing first, second, and third shallow trench isolation ("STI") structures defining the first and second active regions on a silicon substrate; providing a guard ring between the second and third STI structures, the guard ring enclosing the first active region; forming a nitride layer overlying the first and second active regions; forming an oxide layer overlying the nitride layer; removing a first portion of the oxide layer overlying the first active region to expose a first portion of the nitride layer; removing the exposed first portion of the nitride layer using a wet etch method while leaving a second portion of the nitride layer overlying the second active region intact; thereafter, forming a first gate oxide having a first thickness on the first active region, the first gate oxide having a first edge facing the first isolation structure and a second edge facing the second isolation structure, the first edge being separated from the first isolation structure by a first distance and the second edge being separated from the second isolation structure by a second distance; and thereafter, forming a second gate oxide having a second thickness on the second active region, the second thickness being different than the first thickness.

DETAILED DESCRIPTION OF THE INVENTION

Figure 1:
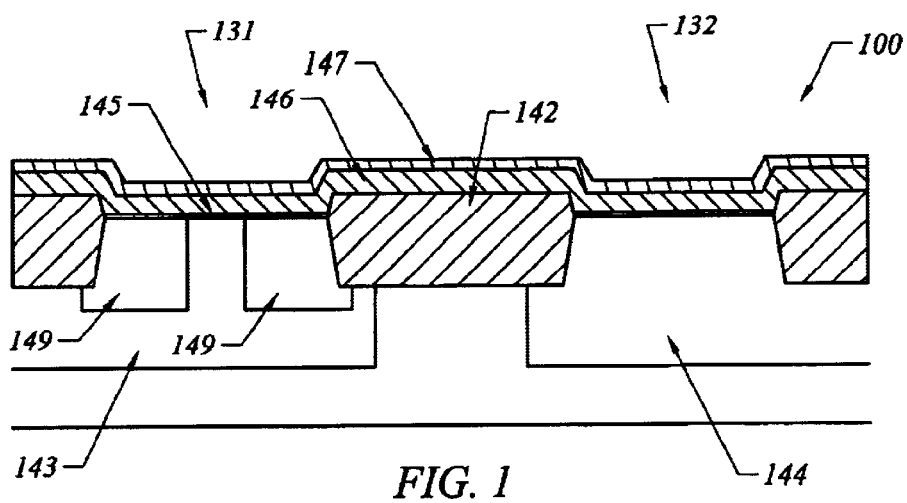
FIGS. 1–12 illustrate a method of forming a semiconductor device having dual gate oxides according to one embodiment of the present invention.

FIG. 1 illustrates a cross-sectional view of a semiconductor substrate or device 100 that has been partially processed according to one embodiment of the present invention.

In one embodiment, the substrate (device) is a silicon substrate (device). The substrate or device 100 includes a high voltage region 131 whereon a thick gate oxide film is to be provided and a low voltage region 132 whereon a thin gate oxide film is to be provided. The high and low voltage regions are defined by a plurality of isolation structures 142, e.g., shallow trench isolations ("STI"). The STI is an oxide filled within a shallow trench to electrically isolate the different active regions in the device 100.

The substrate 100 includes a high voltage well 143 whereon first circuitry operating at a high voltage regime is formed and a low voltage well 144 whereon second circuitry operating at a low voltage regime is formed. The well 143 may be either an N-well for forming PMOS devices or P-well for forming NMOS devices. Similarly, the well 144 may be N-well for forming PMOS or P-well for forming NMOS devices.

Source-drain drift structures 149 are formed within the high voltage well 143. In the present embodiment, such drift structures are not formed in the low voltage well 144 since it will be operating in a low voltage regime. A pad oxide layer 145 is formed overlying the wells 143 and 144. In one embodiment, the pad oxide is provided with a thickness of about 50 angstroms to about 150 angstroms. A nitride layer 146 is formed overlying the pad oxide layer using a low pressure chemical vapor deposition ("LPCVD") method to a thickness of about 200 angstroms to about 500 angstroms. An oxide layer 147 is deposited overlying the nitride layer 146 using a LPCVD method to a thickness of about 150 angstroms to about 350 angstroms. The thicknesses of these films vary according to subsequent etching and stripping steps used for the device fabrication.

Figure 2:
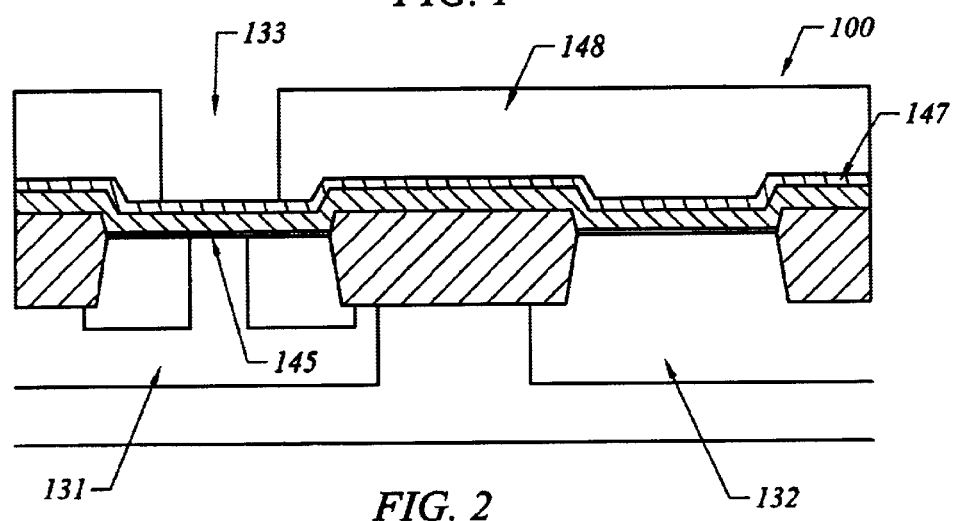

Referring to FIG. 2, a photoresist 148 is coated overlying the wells 143 and 144. The photoresist is patterned to expose a portion of the oxide layer 147 that is overlying the high voltage well 143 to form a high voltage channel region 133. The exposed oxide layer is removed using a wet etch method, e.g., with diluted HF chemical or buffered oxide etchant ("BOE"). Thereafter, the remaining photoresist 148 is stripped using a wet or dry method.

Figure 3:
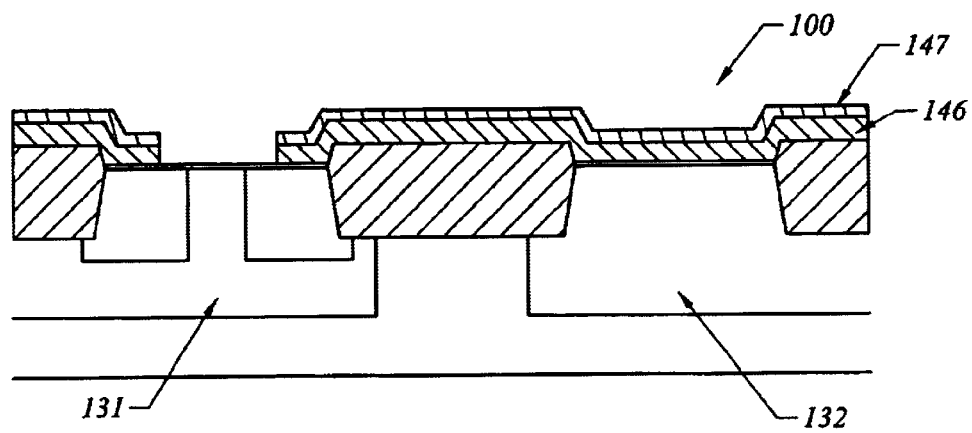

Referring to FIG. 3, a portion of the nitride layer 146 exposed by the partial etching of the oxide layer is also etched, thereby exposing the pad oxide layer 145. The nitride layer 146 is etched using hot phosphoric acid ($H_3PO_4$) according to one embodiment. The pad oxide underneath protects the silicon substrate surface from being damaged by the nitride etch step.

Figure 4:
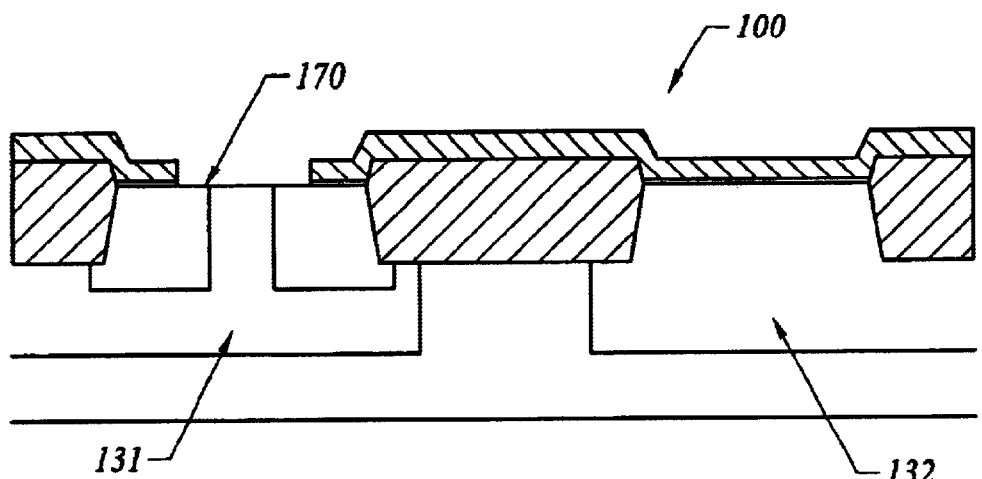

Referring to FIG. 4, the remaining oxide layer 147 and the exposed portion of the pad oxide 145 on the high voltage channel region 133 are etch away together using a wet etchant, e.g., HF acid. A portion 170 of the silicon substrate underlying the removed pad oxide film is exposed as a result of this etch step. The exposed portion of the substrate defines a channel region for the high voltage region 131. The oxide layer 146 and the pad oxide layer 145 have different etch rates in the HF acid since the oxide layer 146 is formed by a deposition method and the pad oxide layer 145 is formed by an oxide growth method so their thicknesses need to be carefully selected to avoid the STI oxide 142 from being etched too much. In order to prevent excessive loss of the STI oxide 142 during this step, the dipping time in the HF acid should be maintained to minimum.

Figure 5:
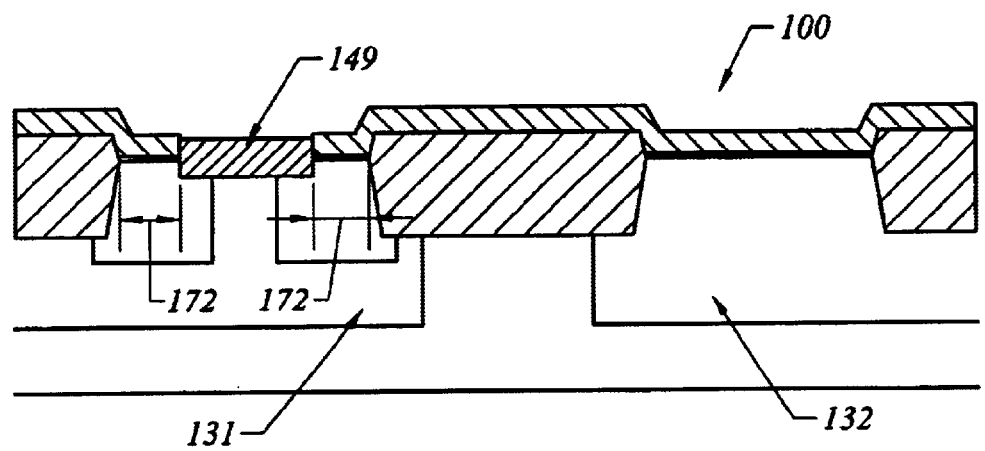

A thick gate oxide 149 is selectively formed over the exposed portion 170 of the silicon substrate (FIG. 5). The gate oxide 149 is provided with a suitable thickness to handle a given voltage that is higher than the operational voltage for the low voltage region 132. In one embodiment, the thick gate oxide is provided with a thickness of about 200 angstroms to about 1200 angstroms and is configured to handle about 5~40 volts. Generally, the thick gate oxide is grown in an oxidation furnace. In one embodiment, the thick gate oxide is provided with an additional thickness, e.g., about 50~200 angstroms, to compensate for loss during subsequent processes. The additional thickness provided varies according to the durations and types of subsequent processes used, as understood by those skilled in the art.

The edges of the gate oxides are separated from the edges of the STI 142 by a given distance 172, thereby leaving portions of the structures 149 exposed for subsequent formation of source and drain regions, as will be explained later. The distance 172 may vary according to the voltage level and application used. In one embodiment, the distance 172 is about 0.9 micron to about 1.5 micron for 0.22 micron 20~40 volt technology.

Figure 6:
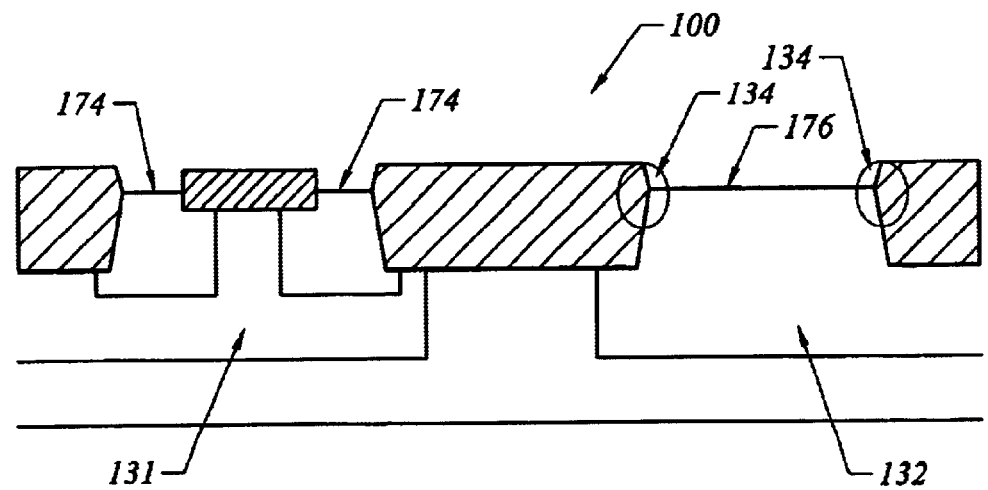

Referring to FIG. 6, the remaining nitride layer 146 is removed using hot phosphoric acid. The pad oxide 145 is removed using HF acid to expose portions 174 of the source-drain drift structures 149 and a portion 176 of the substrate associated with the low voltage region 132. At this time, some of the excess thickness of the thick gate oxide 149 is removed. In one embodiment, wet etch methods are used for both of these removal processes to prevent a residue problem or damage to the silicon substrate that may result from dry etch methods.

During these removal processes, particularly during the pad oxide removal, small grooves or holes 134 are formed at the edges of STI 142 in the low voltage region 132. The pad oxide 145 is over-etched by about 30–50% to ensure its complete removal. Accordingly, the pad oxide preferably is kept relatively thin since a thick pad oxide would require a longer over-etching period that is likely to generated a bigger recess at the edges of the STIs 142. A current leakage and threshold voltage (Vt) variation problems are aggravated as the recess size increases, which are not desirable for device operation.

Figure 7:
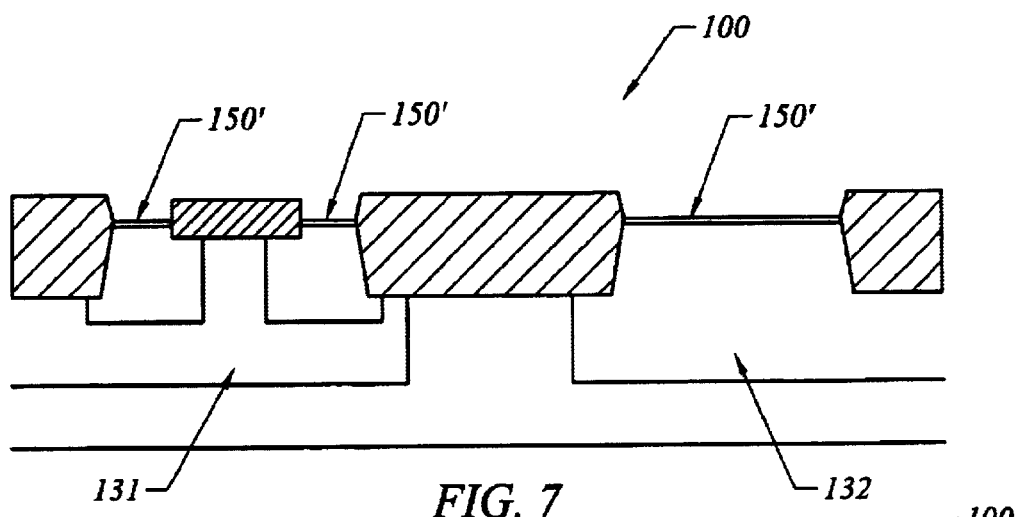

A thin gate oxide 150 is grown overlying the portion 176 that has been exposed by the pad oxide removal (FIG. 7). At this time, a thin oxide layer 150' also is formed overlying the exposed portions 174 in the high voltage region 131. The gate oxide 150 is provided with a suitable thickness to handle a lower voltage than that of the operational voltage for the high voltage region 131. In one embodiment, the thin gate oxide is provided with a thickness of about 35 angstroms to about 65 angstroms and is configured to handle about 1.8 volts to about 3.3 volts. Generally, the thin gate oxide is grown in an oxidation furnace.

Figure 8:
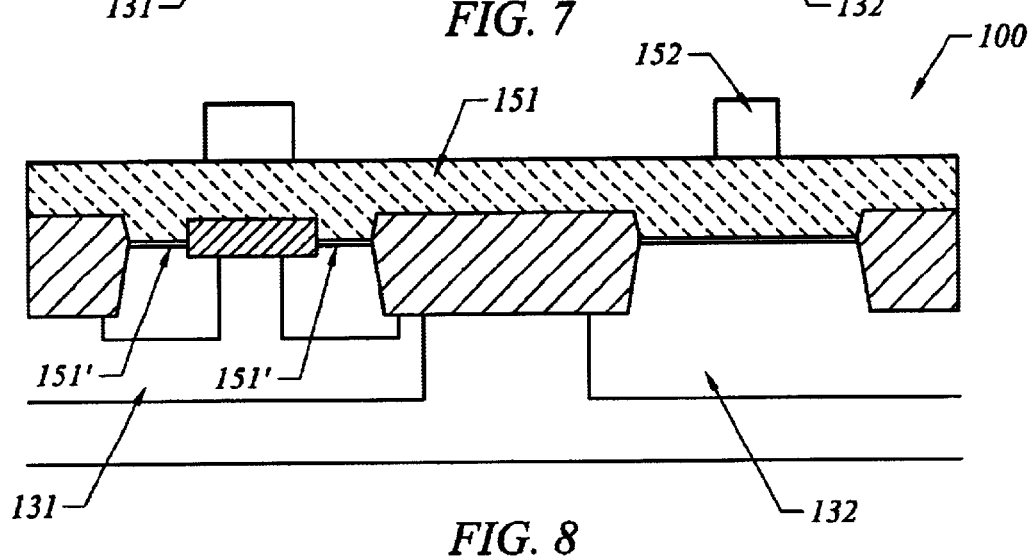
Figure 9:
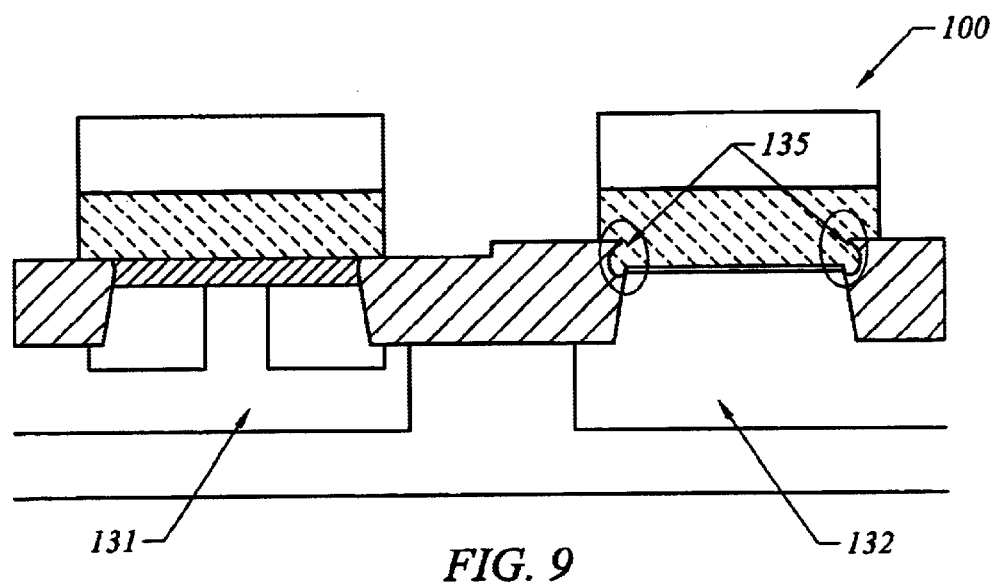

A poly-crystalline silicon or polysilicon 151 (either doped or undoped) is deposited overlying the low and high voltage regions 131 and 132 (FIG. 8). The polysilicon is used as gate electrodes in the present embodiment. A photoresist 152 is formed overlying the polysilicon 151. The photoresist is patterned to mask the portions of the polysilicon directly overlying the channels of the high and low voltage regions. FIG. 9 illustrates a cross-sectional view of the substrate 100 seen from a perpendicular direction from the viewing angle of FIG. 8. In both the low voltage region and high voltage region, the edges of the STI 142 include grooves 135 corresponding to the grooves 134.

Figure 10:
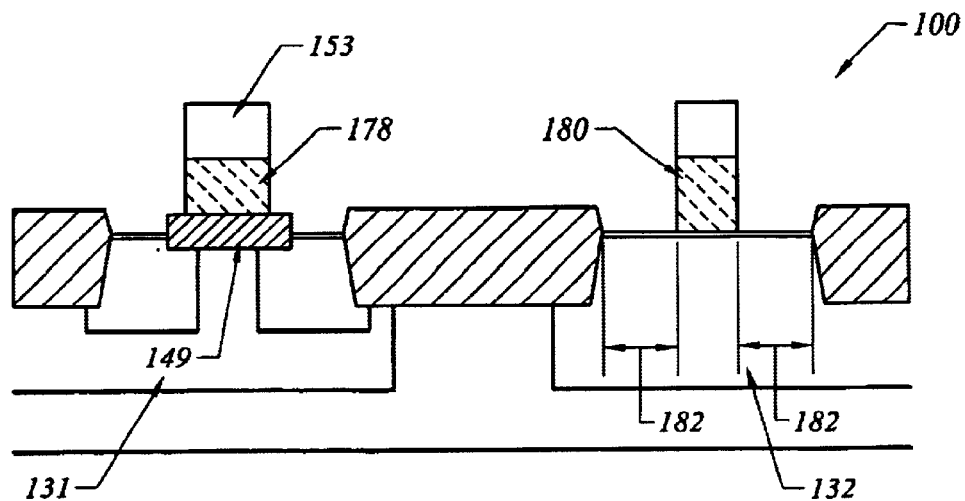

Referring to FIG. 10, the polysilicon 151 is patterned to form a transistor gate 178 for the high voltage region and a transistor gate 180 for the low voltage region. The transistor gate 178 is configured to have edges that are separated from the thick gate oxide 149 by a given distance, e.g. about 0.5 micron. This distance is provided to give margin against the alignment variation.

Figure 11:
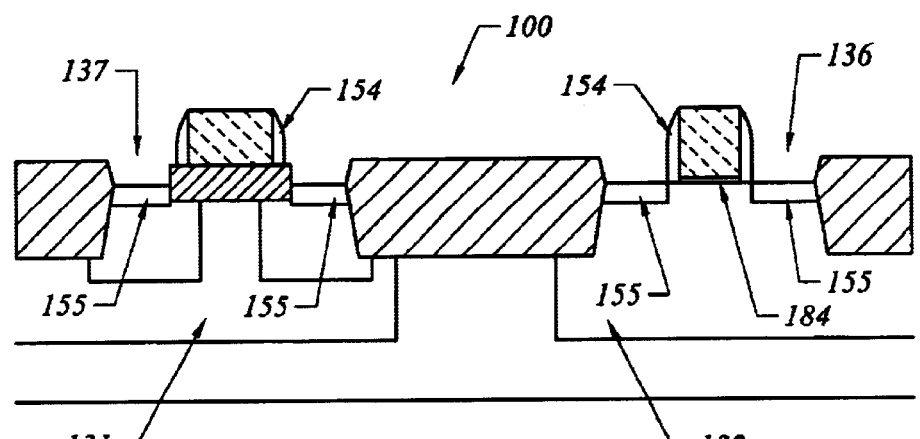

The photoresist 153 is removed (FIG. 11). An oxide layer or nitride layer (or both) is formed using a LPCVD method. The oxide/nitride layer is etched to form a plurality of sidewall spacers 154 at the edges of the gates 178 and 180. The oxide film remaining adjacent to the gate 180 is etched to define a thin gate oxide 184. The oxide film remaining adjacent to the thick gate oxide 149 may also be etched away at the same time.

In one embodiment, the source and drain regions 155 are formed in the high and low voltage regions 131 and 132 by ion implantation prior to removal of the oxide film adjacent the thick gate oxide and the gate 180. The oxide film is etched away after the source and drain regions have been formed.

Figure 12:
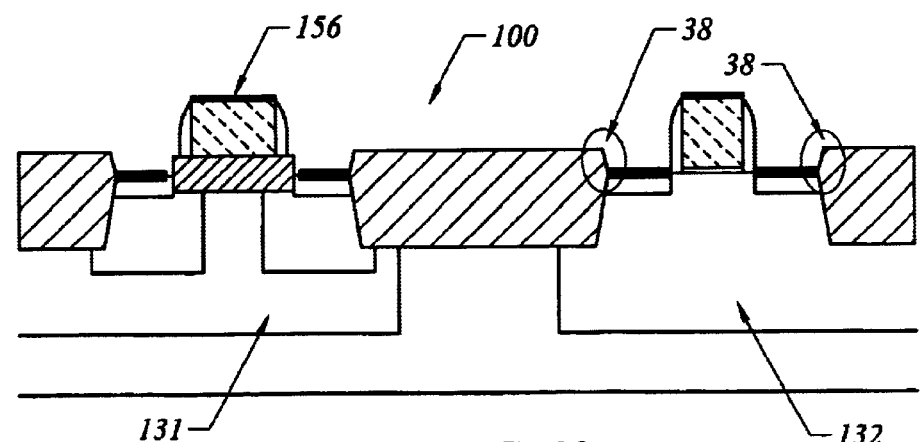

A metal film 156 is deposited (FIG. 12). In one embodiment, the metal is either cobalt or titanium. The deposited metal film is provided with a thermal treatment to form silicidation on the polysilicon gates 178 and 180 and on the source and drain regions 155. No reacted metal film on STI oxide and sidewall spacer is removed at the subsequent wet cleaning step. The source/drain junction can be maintained in a good condition since the STI recess in the active edge 138 is minimized.

Figure 13:
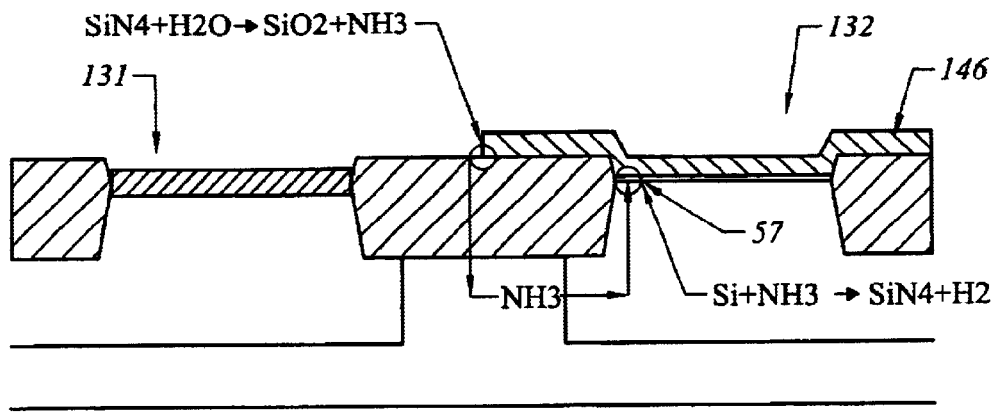
FIG. 13 illustrates potential formation of nitride in a low voltage region as a result of reaction between a nitride layer and $H_2O$ ambient.

Referring to FIG. 13, during the thick gate oxidation (see, FIG. 5), the oxidation ambient $H_2O$ may react with the nitride layer 146 and generate $NH_3$. The generated $NH_3$ diffuses into the low voltage region 132 through the STI 142 and then reacts with silicon to generate $Si_3N_4$ or nitride 157. The nitride 157 may hinder proper formation of the thin gate oxide during the subsequent thin gate oxidation process (see, FIG. 7). Accordingly, the nitride 157, if any is formed, preferably is removed prior to performing the thin gate oxidation process. However, this requires longer etch time at HF chemical which may cause formation of a sizeable STI recess when the thick pad oxide is removed, which may result in a leaky junction.

Figure 14:
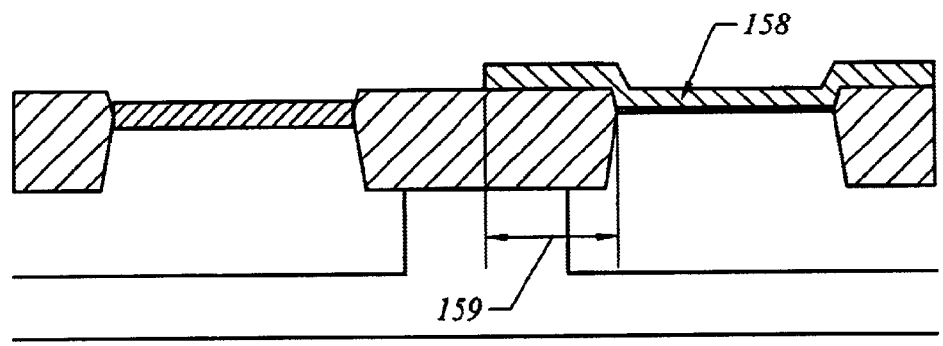
FIGS. 14–15 illustrate a method of providing an overlap offset to prevent formation of nitride in a low voltage region according to one embodiment of the present invention.
Figure 15:
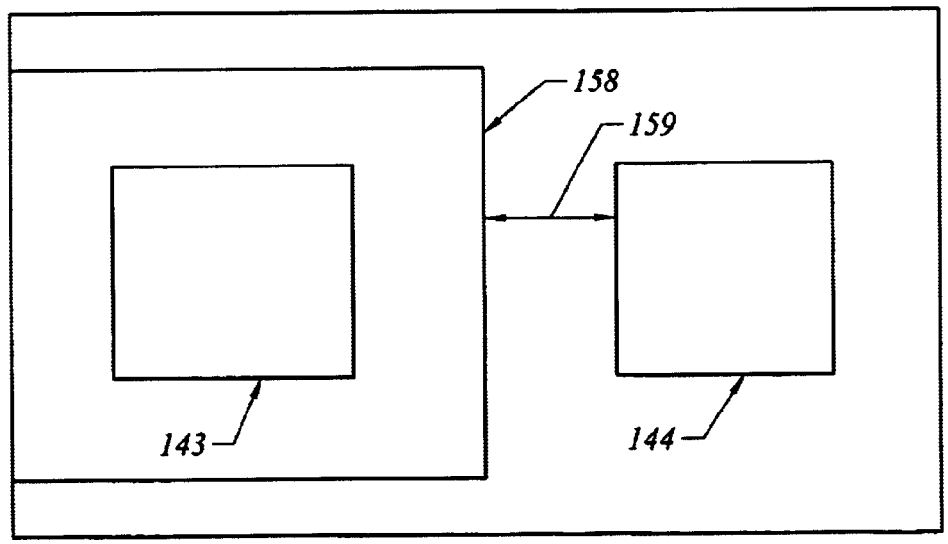

Referring to FIGS. 14 and 15, the inventors have discovered that one way to prevent formation of the nitride 157 and the resulting thin gate oxide degradation is by providing an overlap offset 159 between the low voltage active region and the thick oxidation mask 158. In one embodiment, the offset 159 is at least about 3.5 um for growing a thick gate oxide having a thickness of about 700 angstroms and at least about 4.5 um for a thick gate oxide having a thickness of about 950 angstroms. The overlap offset value varies according to oxidation conditions, STI oxide characteristics, etc.

Figure 16:
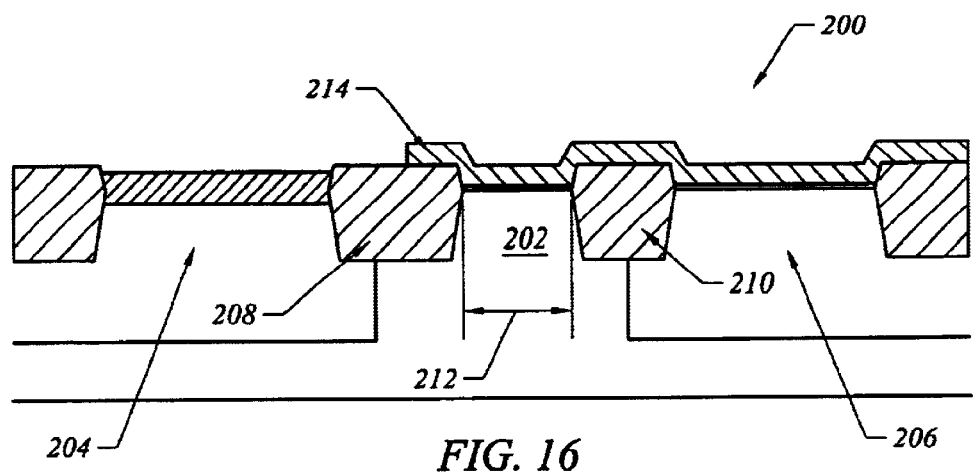
FIGS. 16–18 illustrate a method of providing a guard ring between a high voltage region and a low voltage region to prevent nitridation on the low voltage region according to one embodiment of the present invention.

FIG. 16 illustrates a semiconductor device or substrate 200 that has been provided with a guard ring 202 separating a high voltage region 204 from a low voltage region 206 according to one embodiment of the present invention. The guard ring 202 is defined by a first shallow trench isolation ("STI") 208 and a second STI 210. The guard ring comprises a material different than that of the STIs 208 and 210. In one embodiment, the STIs 208 and 210 are oxides and the guard ring 202 is silicon. The guard ring has a width 212 that varies according to the device technology. For example, the width 212 is about 0.25 or greater for the 0.25 micron technology, preferably about 0.25 micron to about 0.35 micron, more preferably about 0.27 micron. The width 212 is about 0.18 micron or greater for the 0.18 micron technology, preferably about 0.18 micron to about 0.30 micron, more preferably about 0.22 micron. In another embodiment, the width 212 is provided with the minimum dimension that is associated with a given process technology; e.g., the width 212 is about 0.25 micron for 0.25 micron technology and about 0.18 micron for 0.18 micron technology.

Figure 17:
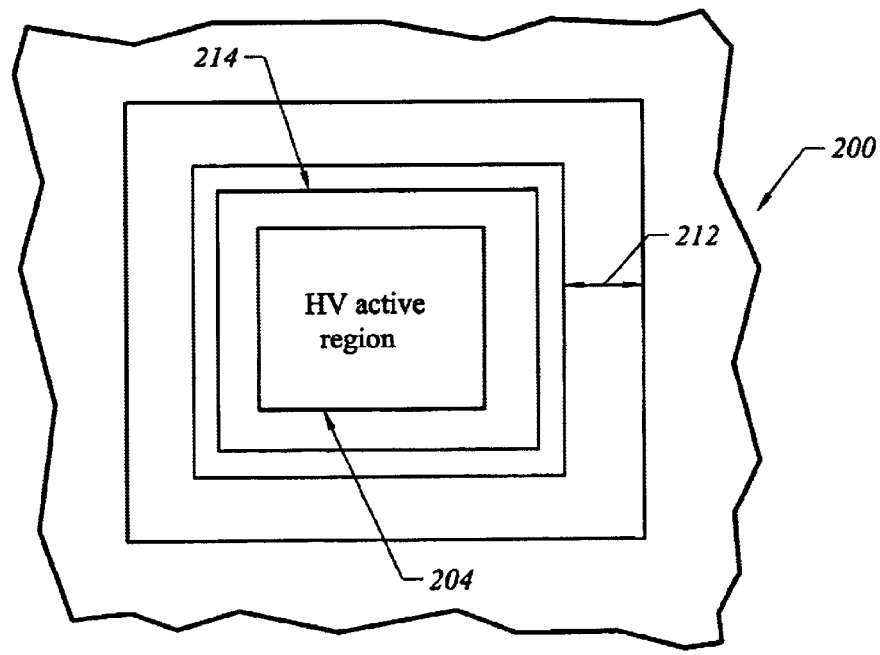

In one embodiment, the guard ring 202 surrounds the high voltage region to prevent impurities, $NH_3$, from diffusing into the low voltage region (FIG. 17). The $NH_3$ resulting from the reaction between a nitride layer 214 (or the nitride layer 146 in the device 100) and ambient $H_2O$, is prevented from diffusing into the low voltage region 206 since the migrating $NH_3$ reacts with silicon atoms in the guard ring 202. Using the guard ring, $NH_3$ is prevented from entering the low voltage region, and the nitridation in the low voltage region is suppressed. As a result, a good quality gate oxide is formed from the thin gate oxidation process.

Figure 18:
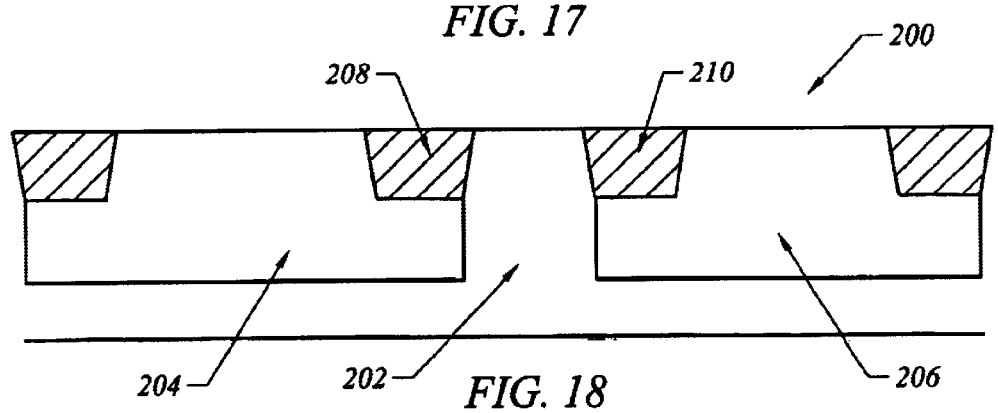

In one embodiment, the device 200 having the guard ring 212 is fabricated using substantially the same steps as that used to fabricate the device 100. One difference is that the device 200 is provided with at least two STIs to separate the high voltage region and the low voltage region. FIG. 18 illustrates the device 200 provided with the first and second STIs 208 and 210 that are placed apart to define the guard ring therebetween. The formation of such structures can be performed using convention techniques. The subsequent process steps for the device 200 follow the steps described above in connection with the device 100 (see, FIGS. 1–12).

While the invention has been particularly shown and described with reference to the preferred embodiments thereof, it will be understood by those skilled in the art that various changes in form and details may be made without departing from the spirit and scope of the invention.

What is claimed is:

1. A method for making a semiconductor device having a first active region and a second active region, the first active region using a first operational voltage and the second active region using a second operational voltage that is different from the first voltage, the method comprising:

providing first and second isolation structures defining the first active region on a substrate;

forming a nitride layer overlying the first and second active regions;

forming an oxide layer overlying the nitride layer;

removing a first portion of the oxide layer overlying the first active region to expose a first portion of the nitride layer;

removing the exposed first portion of the nitride layer using a wet etch method while leaving a second portion of the nitride layer that is overlying the second active region intact;

thereafter, forming a first gate oxide having a first thickness on the first active region, the first gate oxide having a first edge facing the first isolation structure and a second edge facing the second isolation structure, the first edge being separated from the first isolation structure by a first distance and the second edge being separated from the second isolation structure by a second distance; and thereafter, forming a second gate oxide having a second thickness on the second active region, the second thickness being different than the first thickness.

2. The method of claim 1, further comprising:

providing a pad oxide layer on the substrate and underlying the nitride layer, the pad oxide layer covering the first and second active regions;

removing a first portion of the pad oxide layer overlying the first active region to expose the substrate underneath, wherein the first gate oxide is grown on the exposed substrate in the first active region.

3. The method of claim 2, further comprising:
removing the second portion of the nitride layer overlying the second active region using a wet etch method; and
removing a second portion of the pad oxide layer overlying the second active region to expose the substrate underneath, wherein the second gate oxide is grown on the exposed substrate in the second active region.

4. The method of claim 3, wherein the first portion of the oxide layer is removed using a wet etch method.

5. The method of claim 1, wherein the first distance and second distance of the first gate oxide define first and second openings, the method further comprising:
implanting ions into the first and second openings to form source and drain regions.

6. The method of claim 5, wherein the first and second openings are covered with a thin oxide layer of suitable thickness to facilitate the ion implantation step, the thin oxide layer being thinner than the first gate oxide.

7. The method of claim 1, further comprising:
providing a third isolation structure provided between the second isolation structure and the second active region; and
providing a separation structure between the first and second active region, the separation structure being of different material than the second and third isolation structures.

8. The method of claim 7, wherein the separation structure is provided between the second and third isolation structures.

9. The method of claim 8, wherein the separation structure comprises silicon and the second and third isolation structures comprise silicon oxide.

10. The method of claim 9, wherein the separation structure encloses the first active region to prevent formation of silicon nitride in the second active region.

11. The method of claim 7, wherein the separation structure is a guard ring and the isolation structures are shallow trench isolation structures.

12. The method of claim 1, wherein the first active region is a high voltage region and the second active region is a low voltage region.

13. A method for making a semiconductor device having a first active region and a second active region, the first active region using a first operational voltage and the second active region using a second operational voltage that is different from the first voltage, the method comprising:
providing first, second, and third isolation structures defining the first and second active regions on a substrate;
providing a separation structure between the second and third isolation structures, the second and third isolation structures and the separation structure being provided between the first and second active regions;
forming a nitride layer overlying the first and second active regions of the substrate;
forming an oxide layer overlying the nitride layer;
removing a first portion of the oxide layer overlying the first active region to expose a first portion of the nitride layer;
removing the exposed first portion of the nitride layer while leaving a second portion of the nitride layer that is overlying the second active region intact;
thereafter, forming a first gate oxide having a first thickness on the first active region and being configured to handle the first voltage; and
thereafter, forming a second gate oxide having a second thickness on the second active region and being configured to handle the second voltage, the second thickness being different than the first thickness.

14. The method of claim 13, wherein the isolation structures comprise silicon oxide and the separation structure comprises silicon.

15. The method of claim 13, wherein the isolation structures are shallow trench isolation structures and the separation structure is a guard ring configured to prevent a nitrogen-containing material from diffusing into the second active region.

16. The method of claim 13, wherein the substrate is a silicon substrate, the oxide and nitride layers are removed using first and second wet etch methods, respectively, wherein the separation structure is a guard ring configured to prevent $NH_3$ from entering the second active region.

17. The method of claim 13, wherein the first gate oxide has a first edge facing the first isolation structure and a second edge facing the second isolation structure, the first edge being separated from the first isolation structure by a first distance and the second edge being separated from the second isolation structure by a second distance.

18. The method of claim 17, further comprising:
forming a first doped region in a first area provided between the first edge and the first isolation structure and a second doped region in a second area provided between the second edge and the second isolation structure.

19. The method of claim 18, wherein the first and second doped regions are source and drain regions and are formed by an ion implantation method.

20. A method for making a semiconductor device having a first active region and a second active region, the first active region using a first operational voltage and the second active region using a second operational voltage that is different from the first voltage, the method comprising:
providing first, second, and third shallow trench isolation ("STI") structures defining the first and second active regions on a silicon substrate;
providing a guard ring between the second and third STI structures, the guard ring enclosing the first active region;
forming a nitride layer overlying the first and second active regions;
forming an oxide layer overlying the nitride layer;
removing a first portion of the oxide layer overlying the first active region to expose a first portion of the nitride layer;
removing the exposed first portion of the nitride layer using a wet etch method while leaving a second portion of the nitride layer overlying the second active region intact;
thereafter, forming a first gate oxide having a first thickness on the first active region, the first gate oxide having a first edge facing the first isolation structure and a second edge facing the second isolation structure, the first edge being separated from the first isolation structure by a first distance and the second edge being separated from the second isolation structure by a second distance; and
thereafter, forming a second gate oxide having a second thickness on the second active region, the second thickness being different than the first thickness.

* * * * *